US010199904B2

(12) United States Patent
Sasaki et al.

(10) Patent No.: US 10,199,904 B2
(45) Date of Patent: Feb. 5, 2019

(54) COOLING A HEAT-GENERATING ELECTRONIC DEVICE

(71) Applicant: Schaft Inc., Tokyo (JP)

(72) Inventors: Akihiko Sasaki, Kita Ku (JP);
Nobuyuki Ito, Kanagawa-Ku (JP);
Junichi Urata, Hachioji (JP)

(73) Assignee: Schaft Inc., Tokyo (JP)

( * ) Notice: Subject to any disclaimer, the term of this patent is extended or adjusted under 35 U.S.C. 154(b) by 0 days.

(21) Appl. No.: 15/441,123

(22) Filed: Feb. 23, 2017

(65) Prior Publication Data

US 2018/0241285 A1 Aug. 23, 2018

(51) Int. Cl.
| | |
|---|---|
| H02K 9/00 | (2006.01) |
| H05K 1/02 | (2006.01) |
| H05K 1/14 | (2006.01) |
| H05K 1/18 | (2006.01) |
| H05K 1/09 | (2006.01) |
| H02K 11/33 | (2016.01) |
| H05K 1/05 | (2006.01) |

(52) U.S. Cl.
CPC ............ *H02K 9/005* (2013.01); *H02K 11/33* (2016.01); *H05K 1/0204* (2013.01); *H05K 1/09* (2013.01); *H05K 1/144* (2013.01); *H05K 1/181* (2013.01); *H05K 1/05* (2013.01); *H05K 2201/042* (2013.01); *H05K 2201/066* (2013.01); *H05K 2201/10166* (2013.01); *H05K 2201/10416* (2013.01)

(58) Field of Classification Search
CPC ........ H02K 9/005; H02K 11/33; H05K 1/021; H05K 1/144; H05K 1/0206

USPC ........................................ 361/719, 721, 783
See application file for complete search history.

(56) References Cited

U.S. PATENT DOCUMENTS

| | | | |
|---|---|---|---|
| 5,673,176 A | 9/1997 | Penniman et al. | |
| 5,933,324 A | 8/1999 | Barrett | |
| 6,151,215 A | 11/2000 | Hoffman | |
| 6,882,536 B2 | 4/2005 | Deeney et al. | |
| 7,194,321 B2 * | 3/2007 | Sun ..................... | G05B 19/4141 |
| | | | 318/34 |
| 7,218,517 B2 | 5/2007 | Wolford et al. | |
| 7,254,036 B2 | 8/2007 | Pauley et al. | |
| 7,425,762 B2 * | 9/2008 | Hasebe ................. | H01L 23/142 |
| | | | 257/707 |

(Continued)

FOREIGN PATENT DOCUMENTS

| | | |
|---|---|---|
| EP | 1638384 A1 | 3/2006 |
| JP | 2015076548 A | 4/2015 |

OTHER PUBLICATIONS

International Search Report and Written Opinion for the related Application No. PCT/IB2018/000235 dated Jn. 21, 2018.

*Primary Examiner* — Mukund G Patel
(74) *Attorney, Agent, or Firm* — Honigman Miller Schwartz and Cohn LLP

(57) ABSTRACT

A system includes a primary Printed Circuit Board (PCB) and a heat transfer device that is attached to the primary PCB. The primary PCB includes a heat generating device and a thermal conductive inlay attached to the heat generating device. The heat transfer device includes a secondary PCB that is thermally coupled to the primary PCB, and a heat dissipation block. The heat dissipation block has a first side attached to the thermal conductive inlay of the primary PCB and a second side attached to the secondary PCB.

18 Claims, 5 Drawing Sheets

(56) References Cited

U.S. PATENT DOCUMENTS

| | | |
|---|---|---|
| 7,742,299 B2 | 6/2010 | Sauciuc et al. |
| 2001/0012212 A1 | 8/2001 | Ikeda |
| 2002/0054480 A1* | 5/2002 | Jitaru ................. H01F 27/06 361/704 |
| 2006/0181857 A1 | 8/2006 | Belady et al. |
| 2009/0040727 A1* | 2/2009 | Decker ............ H01L 23/3677 361/705 |
| 2014/0329405 A1 | 11/2014 | Hsieh |

* cited by examiner

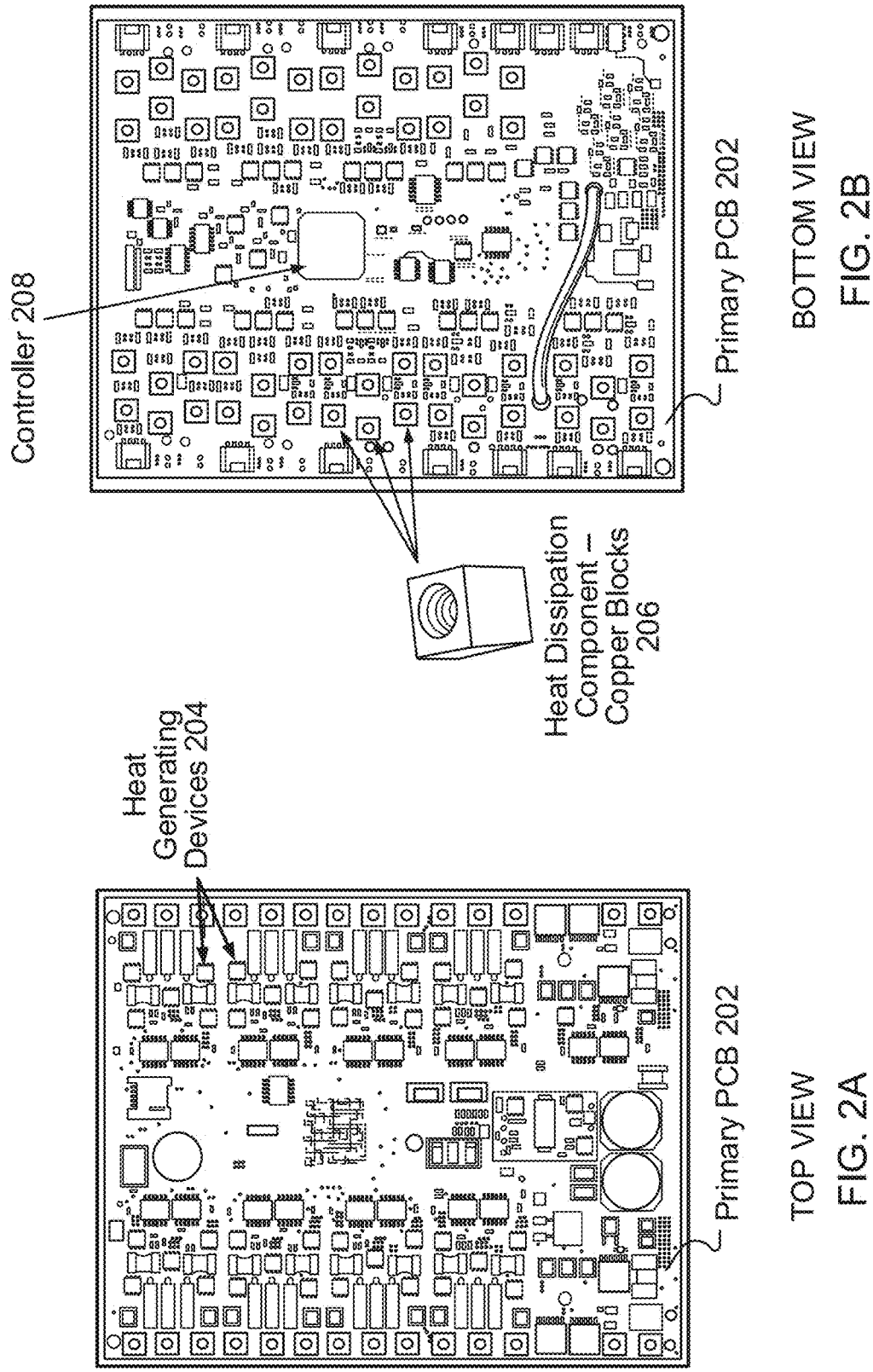

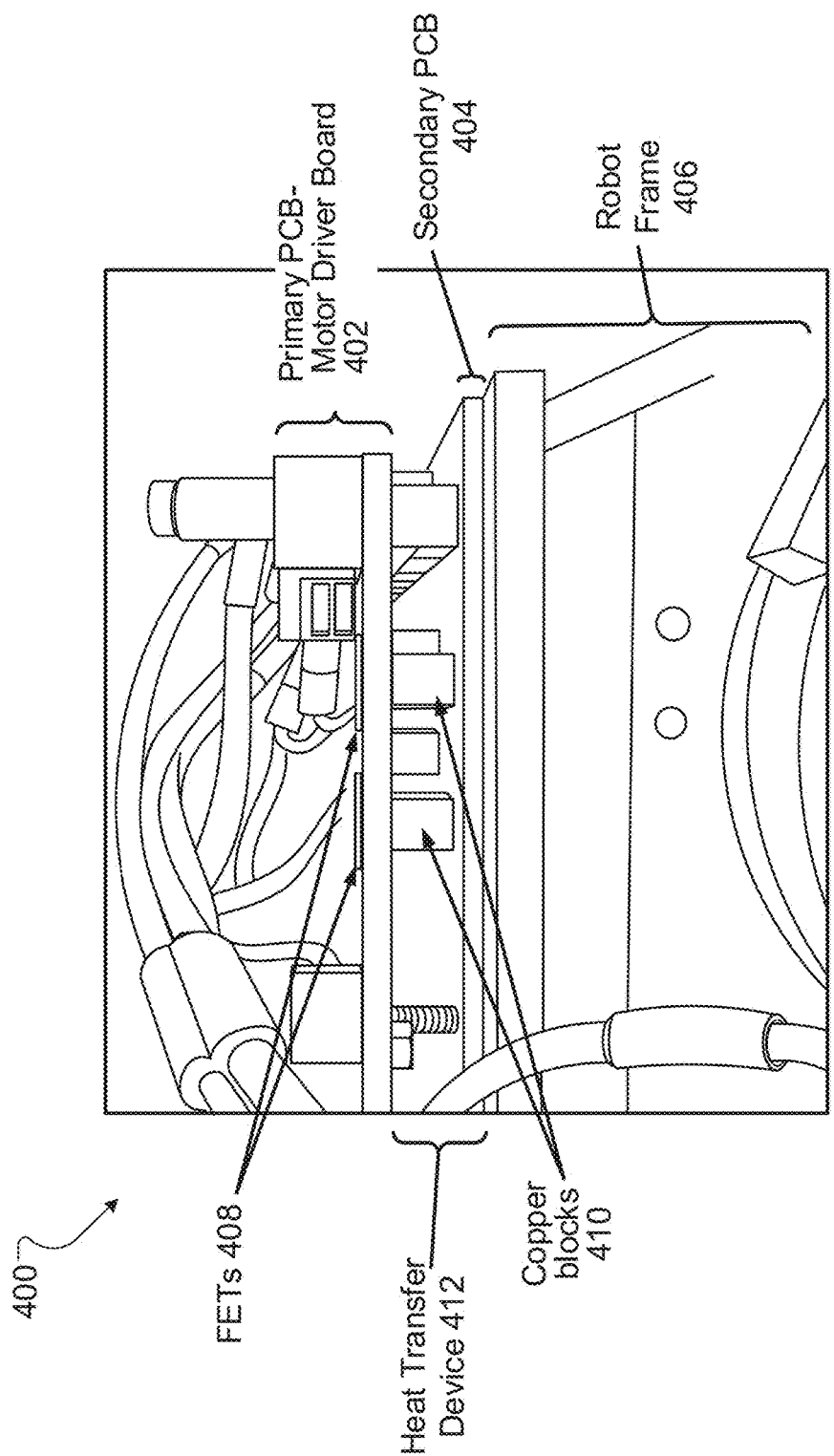

COOLING A HEAT-GENERATING ELECTRONIC DEVICE

TECHNICAL FIELD

This disclosure generally relates to electronic systems, and more particularly to electronic systems that include heat transfer devices used to dissipate heat produced by heat generating devices.

BACKGROUND

Many electronic systems (e.g. robotic systems) include electronic devices that generate heat during operation. In many cases, the performance of these electronic devices varies with temperature, and reliable device operation occurs only within a specific operating temperature range. Excessive temperatures may affect the performance and reliability of the devices and may cause substantial damage to the devices. Therefore, it is necessary to dissipate the heat to maintain the temperatures of the electronic devices within the required operating temperature range.

SUMMARY

This disclosure describes systems, methods, devices, and other techniques for dissipating heat energy generated by electronic devices of an electronic system.

In general, one innovative aspect of the subject matter described in this specification can be embodied in a system that includes: a primary Printed Circuit Board (PCB) that includes at least one heat generating device and at least one thermal conductive inlay, in which the at least one thermal conductive inlay is attached to the at least one heat generating device; and a heat transfer device attached to the primary PCB. The heat transfer device includes a secondary PCB that is thermally coupled to the primary PCB, and at least one heat dissipation component. The at least one heat dissipation component has a first side attached to the at least one thermal conductive inlay of the primary PCB and a second side attached to the secondary PCB.

The foregoing and other embodiments can each optionally include one or more of the following features, alone or in combination. The secondary PCB may include a heat transfer material layer. At least one side of the heat transfer material layer may be at least partially covered by an electrical insulation material layer. The heat transfer material layer may include an aluminum base or aluminum core. The second side of the heat dissipation component may be thermally coupled to a metal layer positioned on the electrical insulation material layer of the secondary PCB. The first side of the at least one heat dissipation component may be soldered to the at least one thermal conductive inlay of the primary PCB. The secondary PCB may be attached to at least one heat sink. The at least one heat generating device comprises at least one of a bipolar transistor, Field-Effect Transistor (FET) (e.g. MOSFET, GaN, and SiC), insulated-gate bipolar transistor (IGBT), integrated chip, resistor, diode, or other electronic component. The thermal conductive inlay may include a metal inlay that is soldered to the at least one heat generating device. The at least one heat dissipation component may include a metal block.

In a second innovative aspect, the subject matter described in this specification can be embodied in a system that includes: a first PCB that includes at least one heat generating device, and a heat transfer device attached to the first PCB. The heat transfer device includes a second PCB that is thermally coupled to the first PCB and exclusive of heat generating devices, and at least one coupling member that includes a heat transfer material. The at least one coupling member has a first side attached to the first PCB and a second side attached to the second PCB.

The foregoing and other embodiments can each optionally include one or more of the following features, alone or in combination. The heat transfer device can be screwed into a heat sink. The first PCB may include at least one thermal conductive inlay that is attached to the at least one heat generating device, and the first side of the at least one coupling member may be attached to the at least one thermal conductive inlay.

In a third innovative aspect, the subject matter described in this specification can be embodied in a robotic system that includes a motor driver board that includes a plurality of heat generating devices and a plurality of metal inlays, in which each of the plurality of metal inlays is attached to one of the plurality of heat generating devices; and a heat transfer device positioned between the motor driver board and a robot frame. The heat transfer device includes a Printed Circuit Board (PCB) that is thermally coupled to the motor driver board, and a plurality of heat dissipation blocks, each of the plurality of heat dissipation blocks having a first side attached to one of the metal inlays and a second side attached to the PCB.

The foregoing and other embodiments can each optionally include one or more of the following features, alone or in combination. The plurality metal inlays may include copper inlays. The plurality of heat dissipation blocks may include copper blocks. In some implementations, the robot frame comprises aluminum alloy. In such implementations, the PCB may include an aluminum-based PCB. In some other implementations, the robot frame may include copper alloy. In such other implementations, the PCB may include a copper-based PCB.

In a third innovative aspect, the subject matter described in this specification can be embodied in a method that includes the actions of receiving heat generated by at least one heat generating device to a thermal conductive inlay of a first Printed Circuit Board (PCB) that supports the heat generating device; transferring the received heat from the thermal conductive inlay of the first PCB through at least one heat dissipation block that is attached to the first PCB and a second PCB; transferring the received heat from the at least one heat dissipation block to the second PCB; and dissipating the received heat at a heat sink that is thermally coupled to the second PCB.

Particular implementations of the subject matter described in this specification can be implemented so as to realize one or more of the following advantages. Implementations enables efficient transfer of the heat generated by heat generating devices of the PCB to a heat sink, improving safety and performance of the PCB. In addition, implementations require less manufacturing and assembly costs than present systems and methods while maintaining reliable electrical insulation between the PCB and the heat sink The details of one or more implementations of the subject matter of this disclosure are set forth in the accompanying drawings and the description below. Other features, aspects, and advantages of the subject matter will become apparent from the description, the drawings, and the claims.

DESCRIPTION OF DRAWINGS

FIG. 2A depicts a top view of an example PCB.

FIG. 2B depicts a bottom view of the example PCB.

FIG. 4 illustrates a robotic implementation of the example electronic system.

DETAILED DESCRIPTION

Figure 1:
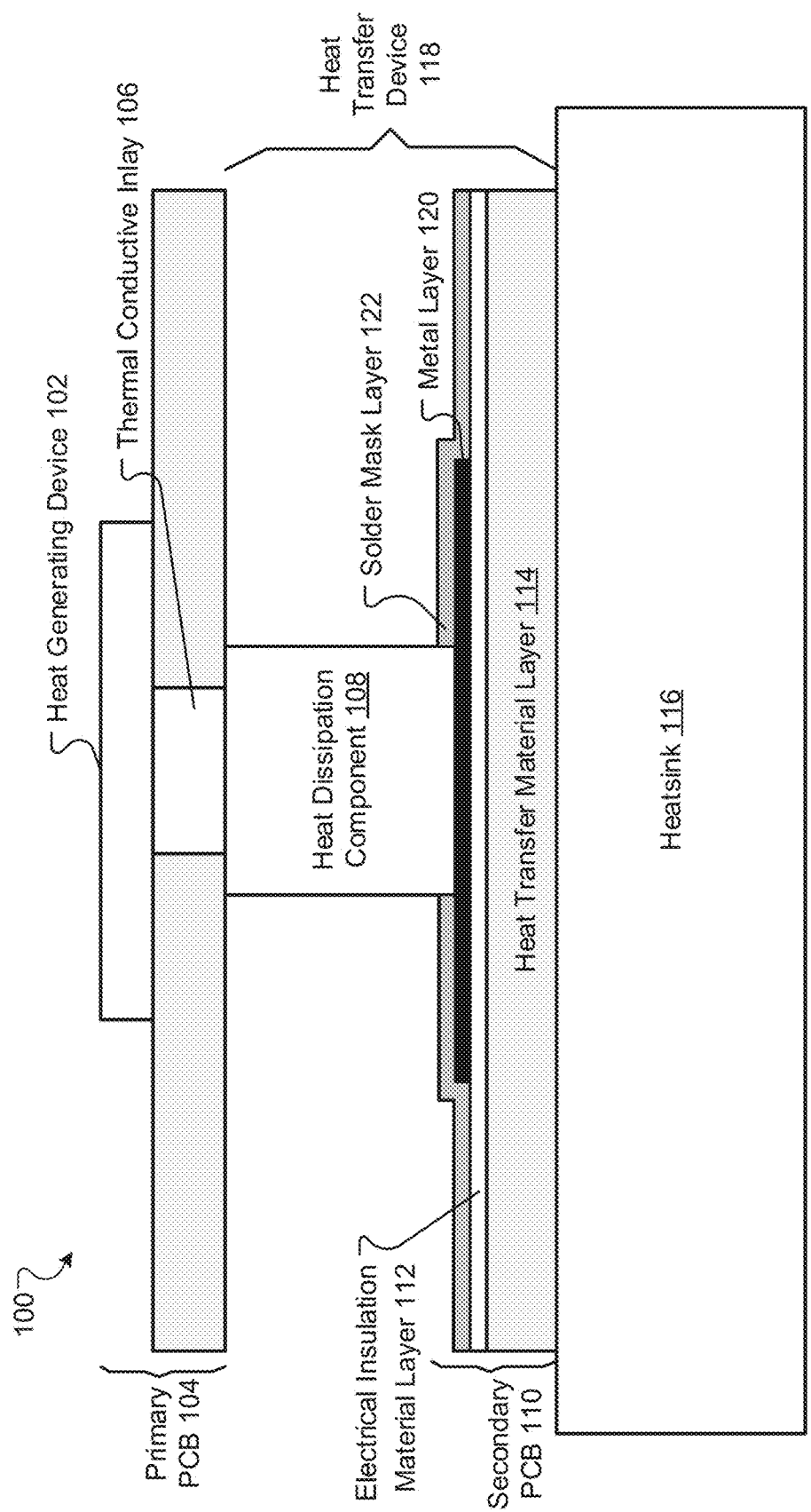
FIG. 1 depicts a cross-sectional view of an example electronic system that includes a PCB and a heat transfer device.

Many electronic systems (e.g. robotic systems) include electronic devices that dissipate electric power during operation, transforming electronic energy to heat energy. An example of an electronic device is a printed circuit board (PCB). A PCB can include multiple layers of different materials, e.g. multiple insulation layers sandwiched between metal layers. A PCB further includes external/internal wiring, and conductive tracks and pads, allowing the PCB to mechanically support and electrically connect various electronic components. In many cases, a PCB is designed and operated to complete a specific task, such as to run a computer or a handheld device. There are various methods for attaching electronic components to a PCB such as soldering or screwing. During operation, electronic components mounted to the PCB generate heat that causes an increase in the temperature of these components and the PCB.

In fact, the performance of the PCB varies with temperature, and in many cases, a reliable operation can only be achieved when the temperature is maintained within a predetermined operating temperature range. In addition, as integrated circuit technology has improved over the last decade, manufactures are able to integrate more and more components onto a single PCB to obtain greater functionality. As the number of components increases, the PCB produces more heat while possessing smaller surface areas to dissipate the heat. When the PCB and its electronic components operate at a temperature that exceeds the upper limit of the operating temperature range, the PCB may be broken and severe damage to electronic components may occur. The reliability of the PCB also decreases with increasing operating temperature. Therefore, it is important to quickly transfer the heat generated by the PCB during operation to an ambient environment to maintain a proper operating temperature and to ensure reliable performance. For example, the PCB can be coupled to a heat sink, which performs as an ambient environment that absorbs the heat transferred from the PCB. For this purpose, the heat sink is generally formed by a thermal conductive material.

While it is important to maintain high thermal conductivity between the PCB and the heat sink, it may also be important to have electrical insulation between the PCB and the heat sink. As each electronic component of the PCB has a different electrical potential, the lack of electrical insulation may cause short circuit, leading to sudden malfunctions or breakdowns of the PCB. Therefore, in example implementations, an insulation sheet such as a silicon rubber sheet is used between the PCB and the heat sink.

However, insulation sheets have large thermal resistance that negatively affects the thermal conductivity of the medium between the PCB and the heat sink. Insulation sheets reduce the amount of heat being dissipated to the heat sink and thus restrict the performance of the PCB. In some cases, a thinner insulation sheet can be selected to reduce thermal resistance. However, in such cases, manufacturing and assembly costs become more expensive and the electrical insulation functionality becomes less reliable. Consequently, there is a need for cost-effective systems and methods that can efficiently transfer heat from a PCB to a heat sink while maintaining sufficient electrical insulation between the PCB and the heat sink.

This disclosure describes systems, methods, devices, and other techniques for dissipating heat energy generated by electronic devices of an electronic system at a heat sink. The electronic system discussed herein includes a PCB and a heat transfer device. The PCB and heat transfer device include unique components that are arranged in a specific way that enables efficient transfer of the heat generated by heat generating devices of the PCB to a heat sink, thus maintaining the temperatures of the electronic devices within the required operating temperature range. At the same time, the heat transfer device is able to maintain reliable electrical insulation between the PCB and the heat sink. In addition, implementations of the electronic system discussed herein may require less manufacturing and assembly costs than present systems, as the PCB and heat transfer device can be manufactured using generic technology.

FIG. 1A depicts an example electronic system 100 that includes, but is not limited to, a first PCB, (e.g., a primary PCB 104) and a heat transfer device (e.g. a heat transfer device 118) that can remove the heat generated by the first PCB. The primary PCB 104 is a composite of multiple layers of different materials such as insulation layers sandwiched between one or more metal layers. The primary PCB 104 may include external and internal wiring and conductive tracks and pads, which allow the PCB to mechanically support and electrically connect various electronic components. In some implementations, electronic components can be surface mounted to the primary PCB 104 using soldering or adhesion. In some other implementations, electronic components can have pins soldered into plated-through-holes of the primary PCB 104. As illustrated in FIG. 1, the heat generating device 102 is an electronic component attached to the PCB 104. The PCB 104 may have one or more heat generating devices. A heat generating device may include a bipolar transistor, Field-Effect Transistor (FET) (e.g. MOSFET, GaN, or SiC), insulated-gate bipolar transistor (IGBT), integrated chip, resistor, diode, or other electronic component. The heat generating device 102 dissipates electric power, which is transformed to heat energy during operation.

In some implementations, the heat generating device 102 can be attached to the primary PCB 104 using a standard via hole. In some cases, to reduce thermal resistance, a plated via hole can be used.

In some other implementations, to further reduce thermal resistance, the primary PCB 104 can include one or more thermal conductive inlays, e.g. a thermal conductive inlay 106. A thermal conductive inlay can be a metal inlay such as a copper inlay. Each thermal conductive inlay is attached to one of the heat generating devices of the primary PCB 104 to enhance the transfer of heat from the heat generating devices. For example, the thermal conductive inlay 106 is inserted into the bottom of the heat generating device 102. In some cases, the thermal conductive inlay 106 can be inserted into a large via hole of the primary PCB 104. The thermal conductive inlay 106 can be attached to the heat generating device 102 using soldering, adhesion, or other methods.

The heat transfer device 118 is attached to the primary PCB 104. The heat transfer device 118 includes a secondary PCB 110 and one or more coupling members coupled to the second PCB. In some implementations, the secondary PCB does not include heat generating devices. The secondary PCB 110 includes a heat transfer material layer 114. The heat transfer material layer 114 may include a metal base or a metal core. At least one side of the heat transfer material 114 is at least partially covered by a electrical insulation material layer 112. The secondary PCB 110 further includes a metal layer 120 such as a copper layer positioned on the heat transfer material layer 114. In some implementations, the secondary PCB 110 may be at least partially covered by a solder mask layer 122.

The one or more coupling members include a heat transfer material (e.g., metal such as copper) that allows heat from the primary PCB 104 to be dissipated through the secondary PCB 110. Each of the coupling members is coupled to the primary PCB 104 and the secondary PCB 110. In the example of FIG. 1, a coupling member is a heat dissipation component, e.g., a heat dissipation block 108. In this example, the heat dissipation block 108 has six sides. However, coupling members can have different shapes and sizes. The heat dissipation block 108 can include, for example, a metal block such as a copper block. In some cases, the heat dissipation block 108 has a first side attached to the thermal conductive inlay 106. In some other cases, the first side of the the heat dissipation block 108 can be thermally coupled to the heat generating device 102 through a standard via hole. A second side of the heat dissipation block 108 can be attached to the metal layer positioned on the heat transfer material layer 114 of the secondary PCB 110.

The methods in which the heat dissipation block 108 is attached to the primary PCB 104 and secondary PCB 110 may vary. For example, in some implementations, the first side of the block 108 is thermally coupled to the thermal conductive inlay 106 of the primary PCB using soldering method. However, it is not required that the first side of the block 108 is directly soldered to the thermal conductive inlay 106. In some implementations, an offset between the position of the thermal conductive inlay 106 and the block 108 is allowable. The second side of the block 108 is screwed or soldered to the metal layer 120 positioned on the heat transfer material layer 114 of the secondary PCB 110. In some implementations using the soldering method, the solder mask layer 122 can be used for soldering the heat dissipation component 108 to the metal layer 120. In some implementations using the screwing method, a layer of conductive thermal grease or thermal resin can be used between the block 108 and the metal layer 120. Thermal greases may contain particles of thermally conductive material suspended in a viscous silicone or hydrocarbon fluid base. This layer ensures that the thermal interface between the block 108 and the metal layer 120 is devoid of any air gaps, which would reduce the heat removal capability of the heat transfer device.

The heat transfer device 118 is attached to a heat sink, e.g., a heat sink 116. For example, the bottom of the secondary PCB 110 can be screwed to the heat sink 116. In some implementations, a layer of conductive thermal grease can be placed between the secondary PCB 110 and the heat sink 116 to enhance the heat removal capability of the heat transfer device.

FIGS. 2A and 2B depict a top view and bottom view of an example primary PCB 202, respectively. The primary PCB 202 includes multiple heat generating devices (e.g., devices 204) mounted on the surface of the PCB 202. In some implementations, the primary PCB includes a controller such as a controller 208. The controller 208 can be a Field-Programmable Gate Array (FPGA) controller. A heat generating device may include a bipolar transistor, Field-Effect Transistor (FET) (e.g. MOSFET, GaN, and SiC), insulated-gate bipolar transistor (IGBT), integrated chip, resistor, diode, or other electronic component. To reduce thermal resistance, a thermal conductive inlay is inserted into the bottom of each heat generating device. In this example, a copper inlay is attached to the bottom of each heat generating devices using soldering method (not shown). Other methods such as adhesion can be used. The thermal conductive inlays can be made of other conductive materials.

As shown in the bottom view of FIG. 2B, there are multiple heat dissipation components mounted on the backside of the primary PCB 202. The positions of heat dissipation components aligned with the positions of heat generating devices. FIG. 2B shows a number of copper blocks 206 for heat dissipating. However, the heat dissipation components can be formed by other materials and can have different shapes and sizes. Each copper block has 6 sides and a female hole that is used to affix to a pin header of a secondary PCB. Each copper block has one side attached to a heat generating device. As described above, there is a copper inlay positioning between the heat generating device and the copper block. The copper inlay helps to reduce thermal resistance between the heat generating device and the copper block.

Figure 3B:
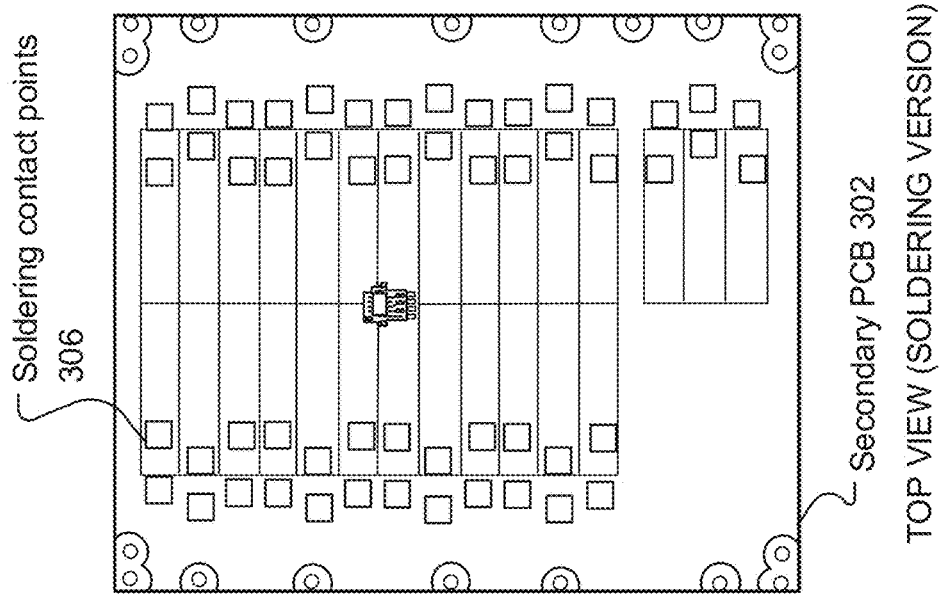
FIG. 3B depicts a top view of another example PCB that includes soldering contact points.
Figure 3A:
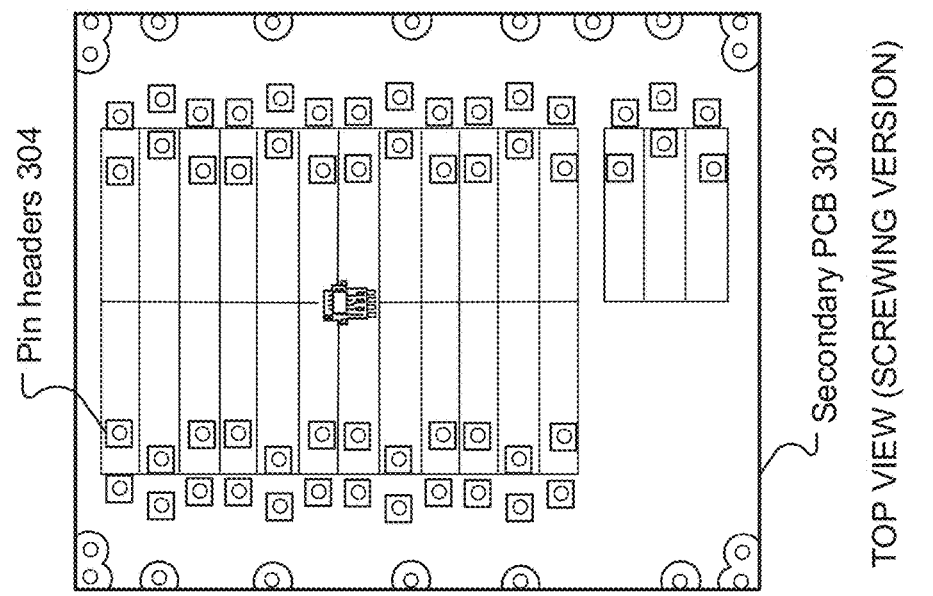
FIG. 3A depicts a top view of an example PCB that includes pin headers.

FIG. 3A depicts a top view of an example secondary PCB 302 that is coupled to a primary PCB (e.g., the primary PCB 202 of FIGS. 2A and 2B) using screwing and soldering methods, respectively. In some implementations, the secondary PCB 302 does not include heat generating devices. As illustrated by FIG. 3A, when using the screwing method, the secondary PCB 302 includes multiple pin headers 304 mounted on the surface of the secondary PCB 302. The positions of the pin headers 304 are arranged to match with the positions of the copper blocks attached to the primary PCB 202. Similarly, as shown in FIG. 3B, when using the soldering method, the secondary PCB 302 includes multiple soldering contact points 306 mounted on the surface of the secondary PCB 302. The positions of the soldering contact points 306 are arranged to match with the positions of the copper blocks mounted on the primary PCB 202. The pin headers 304 and soldering contact points 306 are made of metal such as copper and function as the metal layer 120 in FIG. 1. When the primary PCB and the secondary PCB are attached to each other using the screwing or soldering methods, the copper blocks are affixed to the pin headers 304 or the soldering contact points 306, respectively.

FIG. 4 illustrates an example robotic system 400, which is an implementation of the system 100 in robotics. The robotic system 400 includes a primary PCB. The primary PCB includes a motor driver board 402 that controls the motion of a robot. The motor driver board 402 can drive one or more motors. One or more motors can be used to control one or more joints of the robot.

The motor driver 402 includes multiple heat generating devices, e.g. FETs 408, that generate heat during operation. In some implementations, the motors are brushless motors which require 3-phase sine wave to rotate. In these implementation, the motor driver 402 includes FETs that control currents and voltages of brushless motors by switching. During operation, FETs can incur conduction loss when the FETs are kept on or switching loss when the FETs are turned on or turned off. These losses increase and generate more heat when the currents increase. In some cases, switching loss may cause a large surge instantaneously. In these cases, if the junction temperature of the FETs before the large surge is low enough, the FETs can tolerate the large surge. Otherwise, the FETs may be burned or damaged.

Thus, the FETs may need to dissipate the heat generated during operation to maintain a low junction temperature. In order for the FETs to accept larger heat dissipation, the package size of the FETs may need to be larger, leading to higher manufacturing and assembly costs. Therefore, it may be important to keep the primary PCB's temperature low so that cost-efficient and compact FETs can be used.

For above purposes, the robotic system 400 further includes a heat transfer device 412 that can dissipate the heat generated by the FETs 408. The heat transfer device 412 is coupled to the motor driver 402 and includes (i) multiple heat dissipation components, e.g., copper blocks 410 that dissipate heat from FETs 408; and (ii) a secondary PCB 404. Each of the copper blocks 410 has a first side attached to an FET and a second side attached to the secondary PCB. A heat conductive inlay such as a copper inlay may be inserted into the bottom of a FET (not shown), between the FET and the corresponding copper block. The copper inlays enhance thermal transfer between the FETs 408 and the copper blocks 410. Since copper blocks 410 are electrically connected to each other via FETs, the copper blocks 410 have different voltages The secondary PCB can includes an electrical insulation layer that electrically isolates the copper blocks 410.

The secondary PCB 404 is attached to a heat sink. In this implementation, the heat sink is a robot frame 406 that includes aluminum alloy. Accordingly, the secondary PCB 404 is an aluminum-based PCB. An aluminum-based PCB may include, but is not limited to, a metal layer (e.g., copper layer), a solder mask layer, an electrical insulation layer, and an aluminum-based plate that are pressed together to form the PCB. Due to aluminum properties, aluminum-based PCBs can provide reliable electrical insulation and good thermal conductivity. Thus, when the secondary PCB 404 is an aluminum-based PCB, the secondary PCB has two functions: electrically isolating the copper blocks 410, and thermally connecting the copper blocks 410 and the heat sink.

In some other implementations, the robot frame 406 can include other materials. For example, the robot frame 406 can include copper alloy. In such implementations, the secondary PCB 404 can be a copper-based PCB that includes a copper-based plate. In such implementations, the secondary PCB 404 can have the same functions as described above.

The secondary PCB 404 and the robot frame 406 can be screwed together. Other methods can also be used to attached the secondary PCB 404 to the robot frame 406. A thermal grease layer may be placed between the secondary PCB 404 and the robot frame 406.

Figure 5:
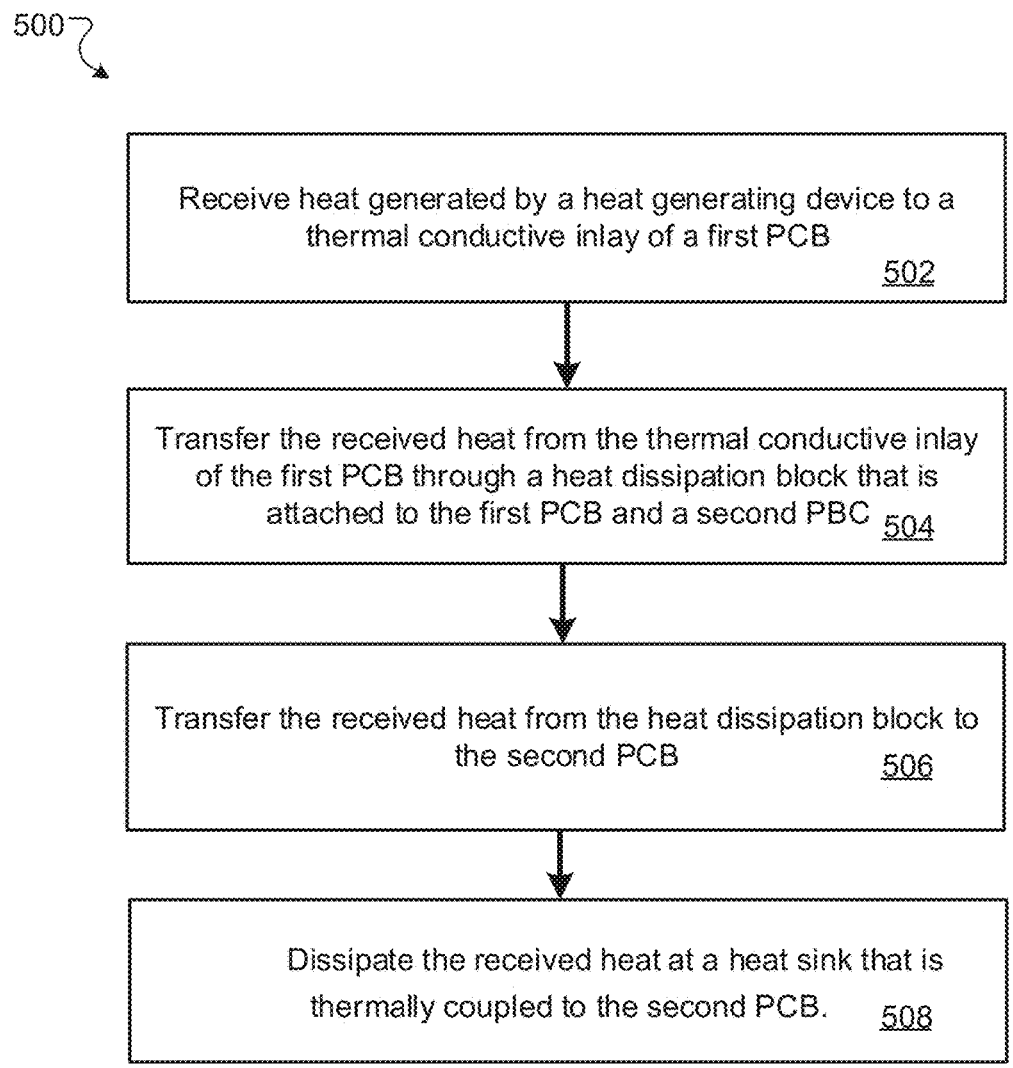
FIG. 5 is a flow diagram of an example process for dissipating heat generated by a PCB at a heat sink.

FIG. 5 is a flow diagram of an example process 500 for dissipating heat generated by a PCB to a heat sink. For convenience, the process 500 will be described as being performed by a system such as the electronic system 100 of FIG. 1.

First, the system receives heat generated by at least one heat generating device to a thermal conductive inlay of a first PCB that supports the heat generating device (step 502). For example, the system may receive heat generated by an FET during operation and transfer the received heat to a copper inlay that is thermally coupled to the backside of the FET (e.g., using soldering method). By thermally coupling the copper inlay to the FET, the thermal resistance between the FET and the first PCB can be significantly reduced as compared to PCBs that do not include a thermal conductive inlay.

Next, the system transfers the received heat from the thermal conductive inlay of the first PCB through at least one heat dissipation block that is attached to the first PCB and a second PCB (step 504). For example, the heat dissipation block can be a copper block. The copper block has a first side thermally coupled to the copper inlay described above. For example, the copper block can be soldered to the copper inlay. As the copper block is thermally coupled to the copper inlay, the thermal resistance between the copper inlay and the copper block can be low, allowing the system to efficiently transfer the received heat from the copper inlay to the copper block. Thus, the system can maintain a low junction temperature for the FET, allowing the FET to have a large temperature margin and to drive more current (e.g., to endure large surge).

Subsequently, the system transfers the received heat from the at least one heat dissipation block to the second PCB (step 506). For example, the second PCB can include a heat transfer material layer such as an aluminum base. The second PCB can be thermally coupled to a second side of the copper block through a metal layer positioned on the heat transfer material layer as described above. Therefore, the system can efficiently transfer the received heat from the copper block to the second PCB.

The system then dissipates the received heat at a heat sink that is thermally coupled to the second PCB (step 508). The heat sink can permit the system to dissipate more heat than direct exposure to an ambient would otherwise allow. For example, the heat sink can be a robot frame. In some implementations, the material of the heat sink matches with the material of the second PCB to enhance the heat transfer capability of the system. In some implementations, thermal greases can be placed between the second PCB and the heat sink to remove air gaps on the thermal interface between the second PCB and the heat sink. These techniques allow the system to quickly dissipate the heat from the second PCB at the heat sink.

The system uses a combination of the thermal conductive inlay, heat dissipation block and second PCB between the first PCB and the heat sink instead of using an insulation sheet as existing systems. The thermal conductive inlay enhances thermal transfer from the heat generating device on the first PCB to the heat dissipation block. The heat dissipation block helps to prevent collision between the components of the first PCB and the second PCB and works as a thermal buffer between the first PCB and the heat sink. The second PCB is composed of specific layers/materials that help achieve both reliable electrical insulation and low thermal resistance between the first PCB and the heat sink. Thus, the system is able to efficiently transfer the heat generated by the first PCB through the thermal conductive inlay and heat dissipation block to the heat sink. In addition, the heat dissipation block and second PCB can be manufactured using generic technology, thus the system may require less manufacturing and assembly costs than existing systems while still achieving desirable heat dissipation and electrical insulation performance.

What is claimed is:
1. A system comprising:
   a primary Printed Circuit Board (PCB) including at least one heat generating device and at least one thermal conductive inlay, the at least one thermal conductive inlay being attached to the at least one heat generating device; and a heat transfer device attached to the primary PCB, the heat transfer device comprising:
a secondary PCB thermally coupled to the primary PCB, wherein the secondary PCB comprises a heat transfer material layer, at least one side of the heat transfer material layer being at least partially covered by an electrical insulation material layer;
at least one heat dissipation component, the at least one heat dissipation component having a first side attached to the at least one thermal conductive inlay of the primary PCB and a second side attached to the secondary PCB, wherein the second side of the at least one heat dissipation component is thermally coupled to a metal layer positioned on the electrical insulation material layer of the secondary PCB; and
at least one heat sink thermally coupled to the secondary PCB and electrically isolated, by an electrical insulation material, from the at least one heat dissipation component,
wherein the electrical insulation material is disposed between the at least one heat dissipation component and the at least one heat sink, and
wherein the heat transfer device is configured to dissipate heat generated by the at least one heat generating device to the at least one heat sink.

2. The system of claim 1, wherein the heat transfer material layer includes an aluminum base or aluminum core.

3. The system of claim 1, wherein the first side of the at least one heat dissipation component is soldered to the at least one thermal conductive inlay of the primary PCB.

4. The system of claim 1, wherein the secondary PCB is attached to the at least one heat sink.

5. The system of claim 1, wherein the at least one heat generating device comprises at least one of a bipolar transistor, Field-Effect Transistor (FET) (e.g. MOSFET, GaN, and SiC), insulated-gate bipolar transistor (IGBT), integrated chip, resistor, diode, or other electronic component.

6. The system of claim 1, wherein the thermal conductive inlay comprises a metal inlay that is soldered to the at least one heat generating device.

7. The system of claim 1, wherein the at least one heat dissipation component comprises a metal block.

8. A system comprising:
a first Printed Circuit Board (PCB) including at least one heat generating device; and
a heat transfer device attached to the first PCB, the heat transfer device comprising:
a second PCB that is thermally coupled to the first PCB and exclusive of heat generating devices, wherein the second PCB comprises a heat transfer material layer, at least one side of the heat transfer material layer being at least partially covered by an electrical insulation material layer;
at least one coupling member comprising a heat transfer material, the at least one coupling member having a first side attached to the first PCB and a second side attached to the second PCB, wherein the second side of the at least one coupling member is thermally coupled to a metal layer positioned on the electrical insulation material layer of the second PCB; and
at least one heat sink thermally coupled to the second PCB and electrically isolated, by an electrical insulation material, from the at least one heat generating device,
wherein the electrical insulation material is disposed between the at least one heat generating device and the at least one heat sink, and
wherein the heat transfer device is configured to dissipate heat generated by the at least one heat generating device to the at least one heat sink.

9. The system of claim 8, wherein the second PCB is screwed into the at least one heat sink.

10. The system of claim 8, wherein:
the first PCB comprises at least one thermal conductive inlay that is attached to the at least one heat generating device; and
the first side of the at least one coupling member is attached to the at least one thermal conductive inlay.

11. A robotic system comprising:
a motor driver board that comprises a plurality of heat generating devices and a plurality of metal inlays, each of the plurality of metal inlays being attached to one of the plurality of heat generating devices; and
a heat transfer device positioned between the motor driver board and a robot frame, the heat transfer device comprising:
a Printed Circuit Board (PCB) thermally coupled to the motor driver board, wherein the PCB comprises a heat transfer material layer, at least one side of the heat transfer material layer being at least partially covered by an electrical insulation material layer; and
a plurality of heat dissipation blocks, each of the plurality of heat dissipation blocks having a first side attached to one of the metal inlays and a second side attached to the PCB,
wherein the second side of each of the plurality of heat dissipation blocks is thermally coupled to a metal layer positioned on the electrical insulation material layer of the PCB, and
wherein the plurality of heat dissipation blocks are electrically isolated from the robot frame by an electrical insulation material disposed between the plurality of heat dissipation blocks and the robot frame.

12. The robotic system of claim 11, wherein the plurality of metal inlays comprises copper inlays.

13. The robotic system of claim 11, wherein the plurality of heat dissipation blocks comprises copper blocks.

14. The robotic system of claim 11, wherein the robot frame comprises aluminum alloy.

15. The robotic system of claim 14, wherein the PCB comprises an aluminum-based PCB.

16. The robotic system of claim 11, wherein the robot frame comprises copper alloy.

17. The robotic system of claim 16, wherein the PCB comprises a copper-based PCB.

18. A method comprising:
receiving heat generated by at least one heat generating device to a thermal conductive inlay of a first Printed Circuit Board (PCB) that supports the heat generating device;
transferring the received heat from the thermal conductive inlay of the first PCB through at least one heat dissipation block that is attached to the first PCB and a second PCB, wherein the second PCB comprises a heat transfer material layer, at least one side of the heat transfer material layer being at least partially covered by an electrical insulation material layer, and wherein the at least one heat dissipation block has a first side attached to the thermal conductive inlay of the first PCB and a second side attached to the second PCB, the second side of the at least one heat dissipation block being thermally coupled to a metal layer positioned on the electrical insulation material layer of the second PCB;

transferring the received heat from the at least one heat dissipation block to the second PCB;

transferring the received heat from the second PCB to a heat sink, the heat sink thermally coupled to the second PCB and electrically isolated from the at least one heat dissipation block by the electrical insulation material, wherein the electrical insulation material is disposed between the at least one heat dissipation block and the heat sink; and dissipating the received heat at the heat sink.

* * * * *